(12) United States Patent
Beaudin et al.

(10) Patent No.: US 6,710,677 B2
(45) Date of Patent: Mar. 23, 2004

(54) BAND REJECT FILTERS

(75) Inventors: Steve A Beaudin, Ottawa (CA); Somsack Sychaleun, Kanata (CA); Chun-Yun Jian, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 9 days.

(21) Appl. No.: 10/074,310

(22) Filed: Feb. 12, 2002

(65) Prior Publication Data

US 2003/0160664 A1 Aug. 28, 2003

(51) Int. Cl.[7] .......................... H03H 9/205; H03H 9/54; H03H 9/64; H03H 9/72; H03F 1/08
(52) U.S. Cl. .................. 333/133; 333/189; 333/193; 330/306
(58) Field of Search ................. 333/133, 193–196, 333/186–192; 330/306

(56) References Cited

U.S. PATENT DOCUMENTS

| | | | | |
|---|---|---|---|---|
| 4,803,449 A | | 2/1989 | Hikita | 333/193 |
| 5,473,295 A | * | 12/1995 | Turunen | 333/132 |
| 5,506,552 A | | 4/1996 | Seki | 333/195 |
| 5,521,453 A | * | 5/1996 | Yatsuda | 310/313 R |
| 5,610,566 A | * | 3/1997 | Chen et al. | 333/194 |
| 5,864,262 A | * | 1/1999 | Ikada | 333/193 |
| 6,201,457 B1 | * | 3/2001 | Hickernell | 333/193 |
| 6,404,302 B1 | | 6/2002 | Satoh | 333/193 |
| 6,489,862 B1 | * | 12/2002 | Frank | 333/187 |

FOREIGN PATENT DOCUMENTS

| | | | |
|---|---|---|---|
| JP | 8-65097 | * | 3/1996 |
| JP | 11-220354 | * | 8/1999 |
| WO | WO 01/58016 A1 | | 8/2001 |

* cited by examiner

Primary Examiner—Barbara Summons
(74) Attorney, Agent, or Firm—Barnes & Thornburg

(57) ABSTRACT

Acoustic resonators such as surface acoustic wave (SAW) devices and thin film bulk acoustic resonators (FBAR) can be configured to produce a band reject filter. Such a filter overcomes the insertion loss and power handling limitations of conventional band pass configurations and as such can be used in power amplifier and duplexer applications.

19 Claims, 4 Drawing Sheets

BAND REJECT FILTERS

FIELD OF THE INVENTION

This invention relates to an RF band reject filter, to a base station power amplifier for a cellular radio network, to a duplexer for a mobile telephone handset, and to a low noise amplifier (LNA) input stage.

BACKGROUND OF THE INVENTION

Surface acoustic wave (SAW) devices have been studied and gradually commercialised since the mid 1960s. Such devices typically have electrodes in the form of interlocked "fingers" (so-called inter-digital electrodes) formed on a piezoelectric substrate. When high frequency signals are applied to the input electrodes, mechanical vibrations in the form of travelling acoustic waves are generated in the piezoelectric substrate which are picked up by the output electrodes. Generally speaking, when the wavelength of the surface acoustic waves and the period of the electrode "fingers" are the same, the magnitude of the surface acoustic waves are at their greatest and the device has a low electrical impedance. At other input frequencies, the device appears to have a higher electrical impedance.

Thus, such a so-called "SAW resonator filter" can be made to have a very precise and narrow (typically having a Q factor over 1000), band pass characteristic. Furthermore, since surface acoustic waves travel across the substrate 100000 times more slowly than the speed of electromagnetic waves, such devices are generally compact. In practice, such devices can be used in a ladder configuration (with a plurality of shunt and plurality of series resonator filters used together). This allows a combined band pass characteristic to be tuned as desired.

Thus such devices have found many uses. However, such devices suffer from two significant disadvantages which prevents their use in some applications. Firstly, band pass filters produced using SAW resonators typically have relatively high insertion losses typically of a minimum of 1 or 2 dB. The state of the art presently is an insertion loss of about 1 dB in the pass band with a rejection of about 15 dB in the stop band for a single stage band pass ladder filter. The losses typically occur as a result of visco-elastic attenuations and/or mode conversions from SAW to bulk acoustic waves when the electrical energy is converted to acoustic energy and travels around the SAW filter cavity. Secondly, the power handling capability of SAW filters is limited. At high powers, the ultrasonic vibration to which the metallic electrodes are subjected eventually causes the metal grain boundaries to migrate. Thus, for example, at the present 1800, 1900 and 2100 MHz cellular mobile bands, such filters cannot be used for a mobile handset duplexer because at these frequencies, such filters cannot survive for a realistic length of time at the desired power levels of approximately 30 dBm.

Relatively little work has been done on SAW notch or band reject filters to date. Of the little work which has been reported, most of it has focussed on the development of narrowband notch filters. One of the first publications on SAW notch filters was in U.S. Pat. No. 4,577,168 (Hartman). Various techniques for implementing SAW notch filters are described in which the conductance within the passband of a Single Phase Unidirectional Transducer (SPUDT) SAW transducer was used as an impedance element to create a notch filter. One implementation used the impedance of a SPUDT in conjunction with an RF transformer and other implementations consisted of replacing the capacitors in a bridge-T type notch filter with a SPUDT transducer impedance element. This approach has one disadvantage in that SPUDT transducers fall into the class of Finite Impulse Response Devices and hence the device must be made longer if narrow notch bandwidths are to be achieved. Furthermore, SPUDT type devices are not easily manufactured at elevated frequencies since ⅛ wavelength electrodes are required.

A variation of this technique is described in S. Gopani and B. A. Horine "SAW Waveguide-Coupled Resonator Notch Filter", Ultrasonics Symposium, 1990, in which a Two-Pole Waveguide Coupled (WGC) Resonator is embedded in an all pass network to implement a notch filter. This technique has two major disadvantages. Firstly the WGC resonator is limited to Quartz hence only bandwidth of 0.1% are attainable and secondly, the resonator has a very poor shape factor of around 5.3 since a typical device might have a 40 dB stopband width of 84 kHz and the 3 dB stopband width of 444 kHz. The device described had a centre frequency of 247 MHz and the insertion losses in the passband were of the order of 4 dB.

A further modification is described in P. A. Lorenz and D. F. Thompson, "Wide Bandwidth Low Cost SAW Notch Filters", Ultrasonics Symposium, 1998. This technique consisted of placing two single pole SAW resonators in series with a resonator in between them. This technique achieved notch depths of more than 40 dB but had a relatively poor shape factor of 4.3 where the 40 dB stopband width was 86 kHz and the 3 dB stopband width was 370 kHz at a centre frequency of 420 MHz. Insertion losses in the stop band were approximately 5 dB or less.

Other simpler implementations consist of using a single pole SAW resonator in series with the signal to obtain a notch at the anti-resonance frequency. Although simple, this filter has a relatively narrow rejection bandwidth, and the shape factor is very poor.

All the reported SAW notch filter developments focused on narrow band notch filters versus wider band reject filters. Furthermore, the techniques consisted of using the impedance of a SAW SPUDT or resonator device in an all pass network to generate a notch response near the passband of the SAW device and leveraged the capacitive properties of the SAW device away from the notch to form an all pass network. Rather poor notch shape factors and insertion losses have been achieved in the reported literature. Therefore there is a need for wider rejection band devices and or lower insertion losses within the passband.

SUMMARY OF THE INVENTION

According to a first aspect of the invention there is provided an RF band reject filter comprising a shunt acoustic resonator and a series acoustic resonator, the shunt resonator being arranged to resonate generally at the reject frequency band and the series resonator being arranged to be anti-resonant generally at the reject frequency band.

The precise placement of the series resonator anti-resonance frequency and shunt resonator resonance frequency can be adjusted to achieve a desired tradeoff between rejection band depth or rejection band width as explained in detail below.

This arrangement overcomes the power handling problem. Conventionally, acoustic resonators are configured to provide a band pass configuration. In this configuration, the series resonators are chosen to be at resonance in the pass band and the shunt resonators are chosen to be at anti-resonance in the pass band. However, by reversing this configuration, a notch or band reject filter is produced.

Such a band reject filter could be used, for example, at a power amplifier output in a base station or handset transceiver with the reject band being tuned to the receive band noise. The filter will readily allow a large transmit signal to pass since the filter is tuned to the receive band and it is thus at receive frequencies that strong acoustic resonance occurs. Since the receive band power is low, and since in the transmit band there is virtually no acoustic resonance, acoustic-electric migration is not a significant factor in such a filter. Thus, the power handling of such a device in the transmit band is limited by electro-migration (and eventually arcing between the electrodes). This occurs at much higher power levels than the power levels which may be passed by a prior art band pass acoustic resonator filter at its pass band frequency.

Furthermore, in this band reject configuration of the present invention, the filter appears as a high Q series and shunt capacitor outside its reject band. By including a high Q matching network, the capacitance (outside the reject band) can be substantially reduced so that insertion losses in the region of 0.2 dB are attainable for a filter having 15 dB attenuation in the reject band.

Thus, for example, such a filter may be used in an UMTS base station in order to reduce the cost of the duplexer module (which presently makes up about 10% of the total cost of the base station cabinet).

Thus, in a second aspect, there is provided a base station power amplifier for a cellular radio network, the power amplifier including at least one inter-stage band reject filter comprising a shunt acoustic resonator and a series acoustic resonator, the shunt resonator being arranged to resonate generally at the reject frequency band and the series resonator being arranged to anti-resonant generally at the reject frequency band.

The use of the band reject filter of the present invention as an interstage filter for a power amplifier is particularly suitable since as noted above, the band reject filter of the present invention appears as a high Q series and shunt capacitor outside the rejection band. The equivalent capacitor has a short delay and therefore produces a very wideband characteristic with good phase linearity and amplitude flatness. This is in contrast to pass band resonators which have a parabolic group delay and hence poor phase linearity. Furthermore, such pass band resonator filters are (as noted above) too lossy in the pass band and have insufficient amplitude flatness for a cellular radio base station amplifier.

In another aspect, there is provided an LNA input stage including a band reject filter comprising a shunt acoustic resonator and a series acoustic resonator, the shunt resonator being arranged to resonate generally at the reject frequency band and the series resonator being arranged to anti-resonant generally at the reject frequency band. In this configuration, forming part of an LNA input stage, the filter may be used to reject power in the transmit band which is incident on the LNA.

In this way (as explained below), the transmit/receive isolation requirements for the base station duplexer may be reduced, for example, from of the order of 90 dB to of the order of 45 dB. This allows a significantly cheaper duplexer to be used for the base station.

Further, another aspect of the invention provides a duplexer for a mobile telephone handset including an RF band reject filter comprising a shunt acoustic resonator and a series acoustic resonator, the shunt resonator being arranged to resonate generally at the reject frequency band and the series resonator being arranged to anti-resonant generally at the reject frequency band.

Such filters may also be used to reject aircraft band interference, TV or radio signals in a handset or base station. They may also be used to suppress an unwanted LO, sideband or image frequency in a TX or RX chain, where the distortion or loss introduced by a bandpass filter would be unacceptable. Such a situation might arise in the case of a transmitter which must carry a predistorted signal such as would be the case in a system employing a baseband predistortion power amplifier. Since any filters would be within the correction loop, they must provide very little amplitude or phase distortion over the frequency ranges of interest.

Furthermore, since the equivalent circuit for a SAW resonator and a thin film bulk acoustic resonator (for example, the FBAR product available from Agilent) are identical, the invention may use a SAW resonator or a thin bulk acoustic resonator for the acoustic resonator component. One advantage of the thin film bulk acoustic resonator implementation is that the filter may be implemented completely in silicon which may, in some applications, provide packaging advantages over a SAW resonator configuration.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

With reference to FIG. 1, two series resonators SR2 and SR4 are connected in the series with an input port 6 and an output port 8. Two parallel resonators PR10 and PR12 are connected in a ladder configuration between the series resonators SR4 and SR2 and a ground terminal 14.

The resonators may be SAW resonators or thin film bulk acoustic resonators.

The series resonators SR4 and SR2 are designed to present a high impedance at the reject band of interest. This is achieved by designing the filters to be in anti-resonance at the reject band frequency. Shunt or parallel resonators PR10 and PR12 are designed to provide a low impedance at the reject band. This is achieved by designing these filters to be at or near resonance in the reject band.

Thus, the overall effect of the filter is to provide a high impedance for signals presented between input terminals 6 and 14, at the reject frequency band.

Figure 1:
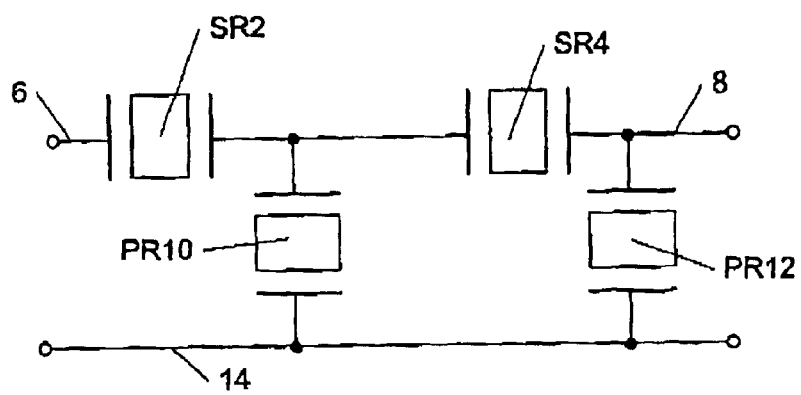
FIG. 1 is a schematic circuit diagram of a ladder configuration of acoustic resonators in accordance with the invention.

In the applications which are explained in more detail below, one of the desirable characteristics of the filter of FIG. 1 is the effect of the filter outside the reject band. In the pass band at frequencies immediately lower than the reject band, the series resonators SR4 and SR2 are at their resonant frequencies while the shunt resonators PR10 and PR12 simply present a capacitive load to ground. In the pass band immediately above the reject band, the shunt resonators PR10 and PR12 are at their anti-resonance frequency and hence present a high impedance to ground while the series resonators SR2 and SR4 present a capacitative series impedance. At frequencies significantly above and below the pass band, the series and shunt resonators simply behave as high Q capacitors.

Figure 2:
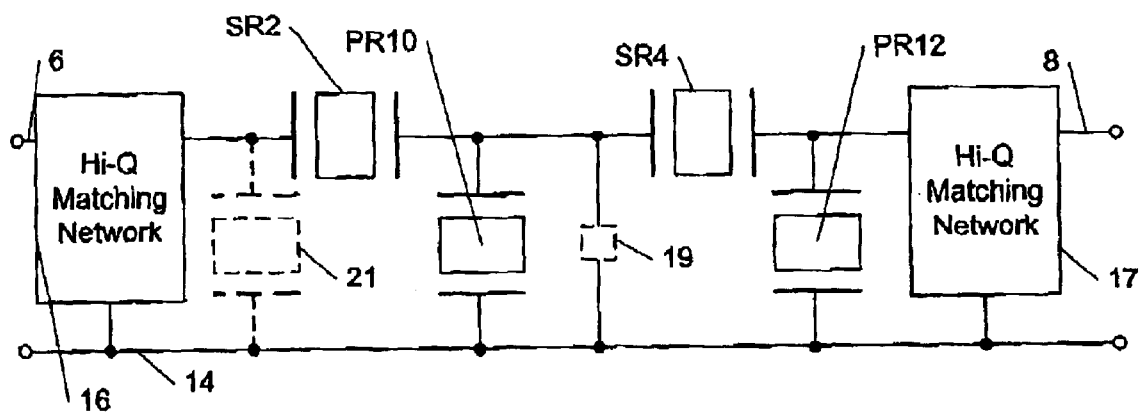
FIG. 2 is a schematic representation of the circuit of FIG. 1 with a high-Q matching network.

Thus, in the pass bands either side of the reject band, the filter appears as a high Q series and shunt capacitor. The capacitor has a very short delay in a very wide band characteristic with excellent phase linearity and excellent amplitude flatness. By incorporating high Q matching networks 16 and 17 as shown in FIG. 2, the insertion loss of the filter outside the reject band may be reduced to of the order of 0.2 dB. The matching networks may be formed as serial and shunt passive inductive and capacitive components as is know in the art.

Optionally, an interstage shunt inductance 19 may be used to aid matching. At frequencies of the order of 2 Ghz and above, matching may be achieved using microstrip matching.

A symmetric response may be achieved using an optional additional shunt resonator 21.

Although FIGS. 1 and 2 show a two stage ladder configuration, it will be appreciated that a single stage (or more than two stages) may be used.

Figures 3, 4:
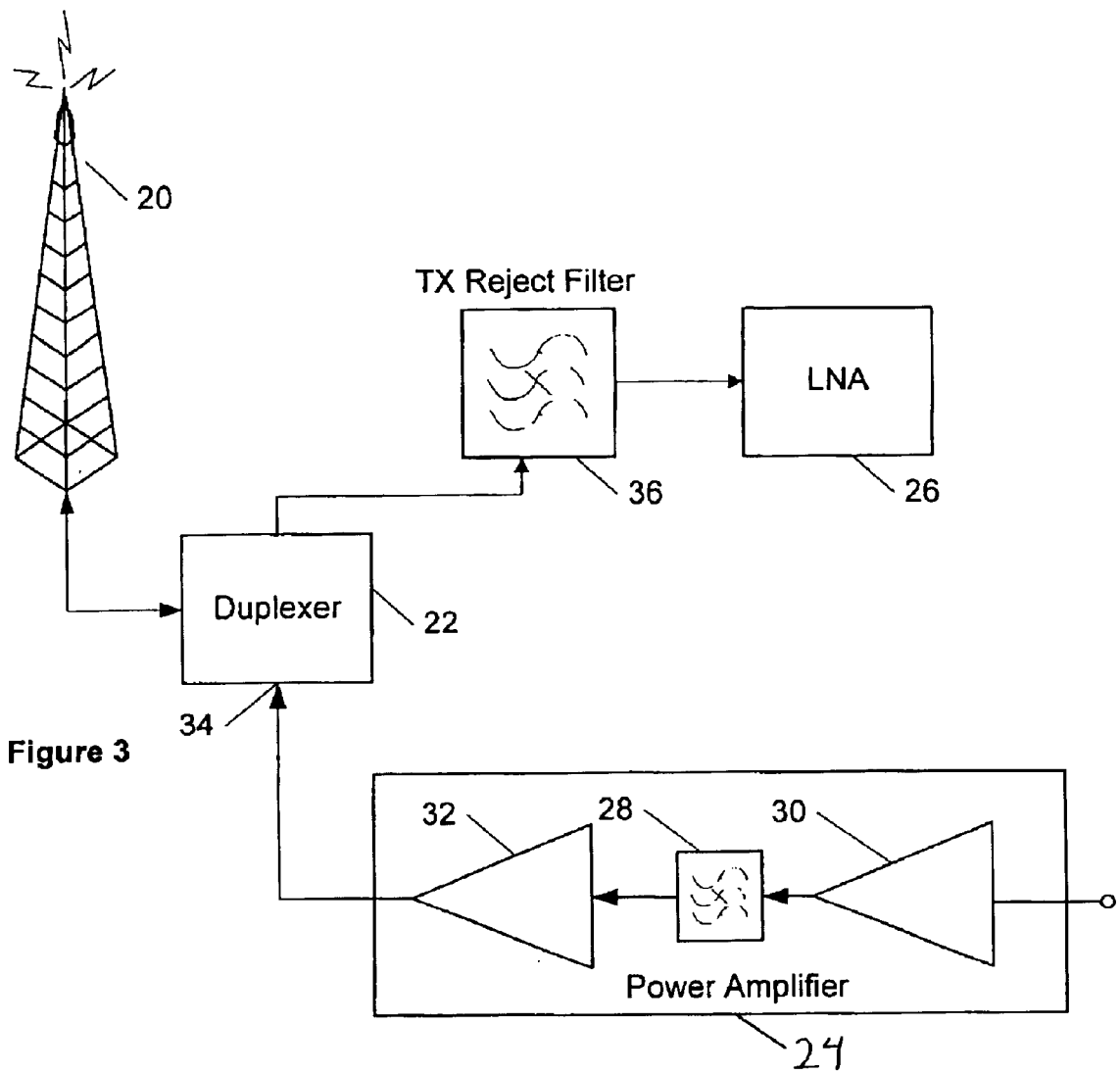
FIG. 3 is a schematic block diagram of a cellular mobile base station including filters in accordance with the invention.
FIG. 4 is a schematic diagram of a mobile handset including a duplexer in accordance with the invention.

FIG. 3 shows an application of the type of filter shown in FIGS. 1 and 2 in a base station for a cellular mobile radio network.

An antenna 20 is used to transmit and receive to and from mobile hand sets at different respective frequencies. A duplexer 22 is used to feed signals in the transmit band, from a power amplifier 24 to the antenna 20 and to feed signals in the receive band from the antenna 20 to a low noise amplifier 26.

A filter 28 used between amplifier stages 30 and 32 of the power amplifier 24, is used to reject frequencies in the receive band. This reduces the energy present in the receive band at the input 34 to the duplexer.

Another acoustic resonator band reject filter 36 is tuned to reject the transmit band at the input stage to the low noise amplifier 26.

By incorporating the filters 28 and 36 into the base station design, the duplexer operating margins may be reduced since the sensitivity of the low noise amplifier to energy in the transmit band is reduced by the filter 36 and the likelihood of the power amplifier 24 introducing energy in the receive band into the duplexer 22 is also reduced. Thus the cost of the duplexer 22 may be reduced which will result in a significant cost saving in the overall cost of the base station.

It will be appreciated that although FIG. 3 shows two amplifier stages 30 and 32 and a single interstage filter 28, the number of amplifier stages and the number of interstage filters may vary from that shown. Similarly, the representation of the band reject filter 36 and the single LNA 26 is intended only to represent one possible example of the use of the filter of the present invention.

FIG. 4 shows a mobile telephone handset 400 which incorporates a duplexer which is similar in operation to the duplexer 22 of FIG. 3. The purpose of the duplexer is to allow simultaneous transmission and reception in different frequency bands using the same antenna whilst ensuring that relatively high power transmit signals do not swamp the received signals which are to be amplified by the low noise amplifier. As noted above, SAW filters conventionally cannot be used for mobile handset applications in the 1800 MHz or above bands because the combination of high power and relatively high frequency rapidly destroys the filter electrodes. Thus in practice, such duplexers are presently built from ceramic filters. However, since the resonant modes of the filter of the present invention are in the receive band (when used in the transmit circuit segment) the high powers do not damage the filter. Thus, both in the base station of FIG. 3 and the mobile handset of FIG. 4, it is possible to use a SAW filter in the transmit circuit.

It will be noted, that the band reject filter may also be used to reject other sources of interference for example from the aircraft band.

Figure 5:
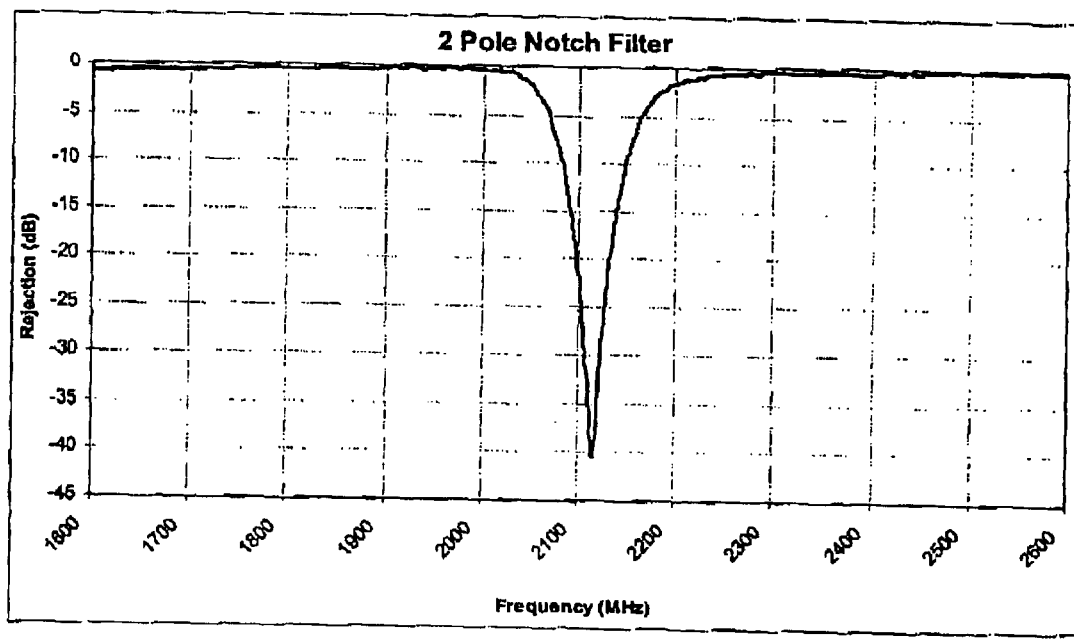
FIG. 5 is a plot of simulated S21 parameters for a first embodiment of the filter.
Figure 6:
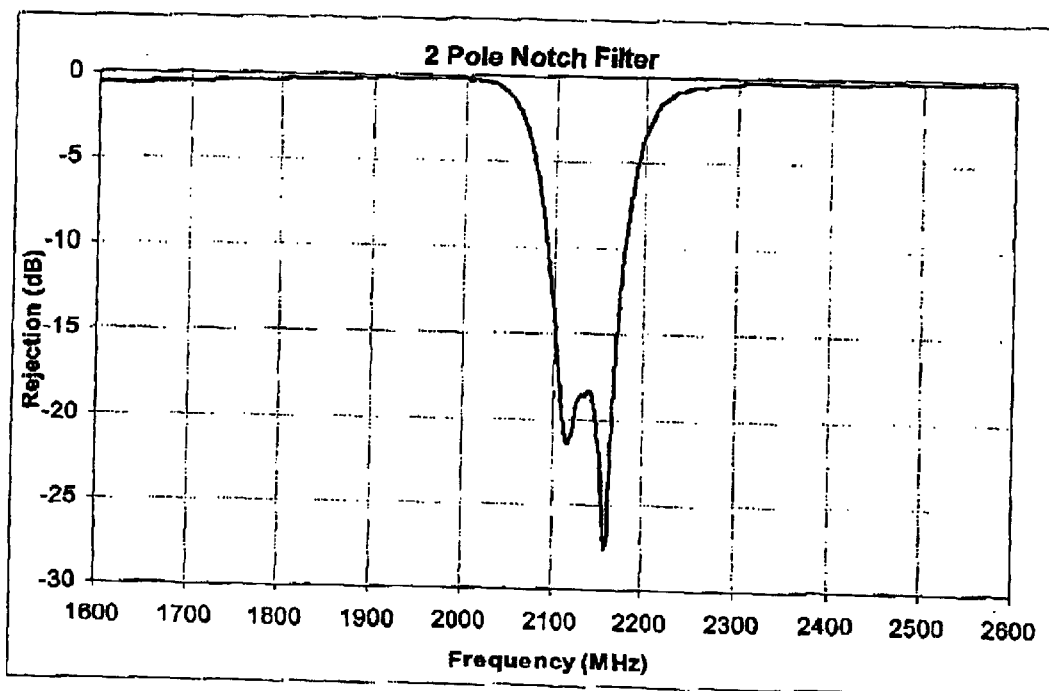
FIG. 6 is a plot of simulated S21 parameters for a second embodiment of the filter.
Figure 7:
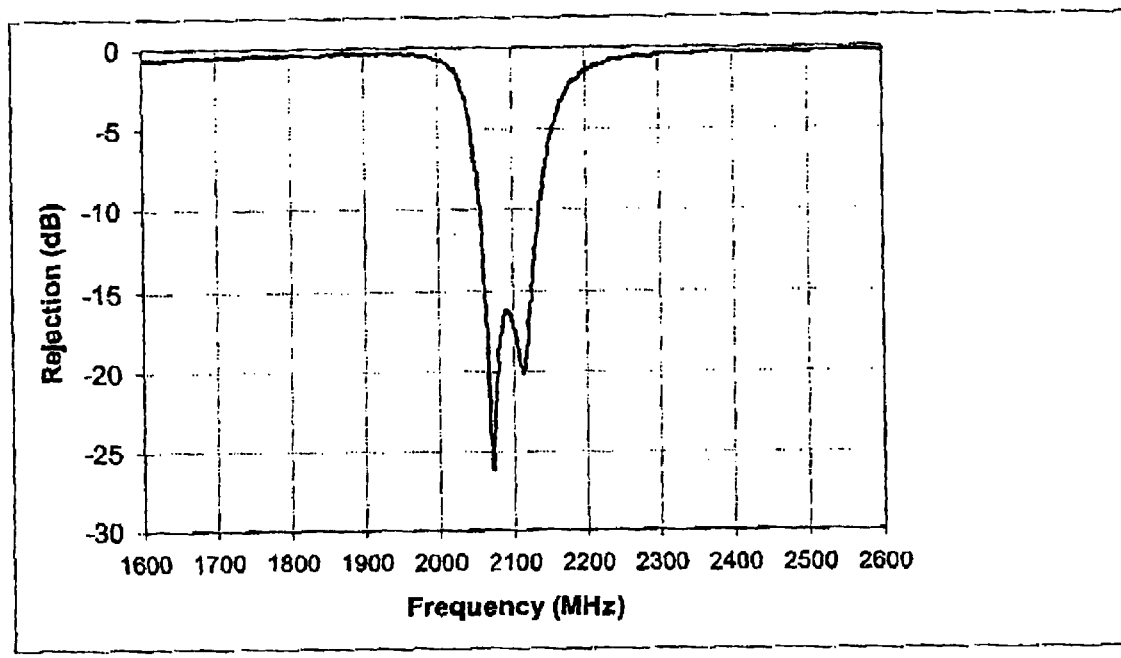
FIG. 7 is a plot of simulated S21 parameters for a third embodiment of the filter.

The precise placement of the series resonator anti-resonance frequency and shunt resonator resonance frequency can be adjusted to achieve a desired tradeoff between rejection band depth or rejection band width. By placing the frequencies in close proximity to each other the rejection depth is maximized at the expense of the rejection band width (FIG. 5) since the ratio of the series impedance to the shunt impedance is maximized at that frequency. By offsetting the resonance frequency of the shunt resonator slightly above (FIG. 6) or slightly below (FIG. 7) the anti-resonance frequency of the series resonator, the rejection bandwidth can be increased at the expense of notch depth.

Figure 8:
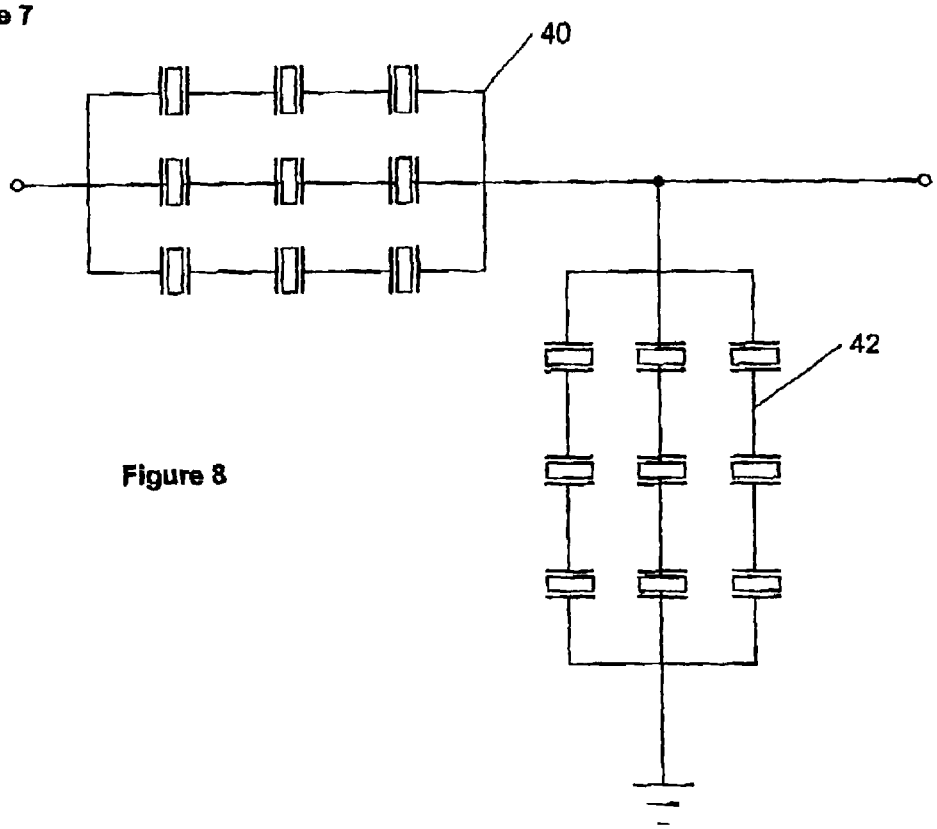
FIG. 8 is a schematic circuit diagram of arrays of resonators in accordance with the invention.

With reference to FIG. 8, the power handling capability of this filter may be increased using arrays of SAW resonators 40 and 42. Each array consists of a plurality of series and parallel resonators (in the example shown a square array is used comprising nine filters arranged in a 3×3 grid). Assuming that parasitic capacitances are adequately controlled, and assuming that each of the resonators in each array is identical, the frequency characteristic of the configuration of FIG. 8 is identical to that of a single series and shunt resonator. However, since the voltages and currents across and through each resonator are divided by virtue of the series and parallel configurations respectively, the overall power handling capability is greatly increased. Thus, for example, using a 3×3 array of resonators as shown, the power handling capability is increased by a factor of 9. This may allow the band reject filter to be used at the power amplifier output of a low power (e.g. 5 watt) micro base station, for example. This configuration may be replicated with more than two arrays.

For the avoidance of doubt, it will be noted that although the invention is described above in connection with single port resonators, multiple port resonators (although believed not to be ideal) could also be used to implement the invention.

Thus, in summary, by building a band reject filter using acoustic resonators, it is possible to use SAW resonator filters in applications for which at least the insertion loss and power handling limitations of conventional band pass resonator filters have proved unsuitable.

For the purposes of this specification, the term "RF" and "radio frequency" are to be construed as limited to the range of frequencies within which SAW resonators, FBARs and any equivalent filters may be designed to operate. This is so because the operating frequency of the band reject filter of the present invention is limited only by the capabilities of the resonators from which it is constructed.

It will be understood that the band reject filters described above can be designed on a large variety of substrates depending on the application and targeted specifications. It is will be appreciated by those skilled in the art that the term SAW can be extended beyond the classical Rayleigh wave and also encompasses Leaky SAWs, Surface Skimming Bulk Waves and Surface Transverse Waves.

The type of wave will depend on the substrate chosen. A few examples of substrates supporting the classical Rayleigh mode are ST Quartz, YZ Lithium Niobate, 128 degree cut X-axis Lithium Niobate, X-cut 112.2 Y-direction Lithium Tantalate to name a few. Examples of substrates supporting leaky surface acoustic waves are LST Quartz, 64 degree YX Lithium Niobate and 36 to 42 degree YX Lithium Tantalate. Examples of substrates supporting surface skimming bulk waves are Rotated Y-cut ST-quartz, 35.5 degree (AT) rotated Y-cut quartz and 36 degree rotated YX-Lithium Tantalate.

Furthermore, this device may be designed on multi-layer substrates such as, but not limited to, Lithium Tantalate with an $SiO_2$ layer or a diamond substrate consisting of Si/Diamond/ZnO/Al/$SiO_2$ such as that presently being developed by Sumitomo.

What is claimed is:

1. A radio frequency band reject filter comprising a shunt acoustic resonator and a series acoustic resonator, the shunt resonator being arranged to resonate generally at the reject frequency band and the series resonator being arranged to anti-resonate generally at the reject frequency band, wherein the resonators are arranged such that there is substantially no acoustic resonance over a predetermined pass band.

2. A radio frequency filter according to claim 1, comprising a plurality of shunt acoustic resonators each arranged to resonate generally at the reject frequency band and a plurality of series acoustic resonators each arranged to anti-resonate generally at the reject frequency band, the shunt and series acoustic resonators being arranged in a ladder configuration.

3. A radio frequency filter according to claim 2, further including a high Q matching network arranged to reduce the apparent capacitance of the filter outside the reject frequency band.

4. A radio frequency filter according to claim 2, wherein the acoustic resonators are one port devices.

5. A radio frequency filter according to claim 2, wherein the acoustic resonators are surface acoustic wave resonators.

6. A radio frequency filter according to claim 2, wherein the acoustic resonators are thin film bulk acoustic resonators.

7. A radio frequency band reject filter according to claim 1, wherein the shunt and series acoustic resonators are each formed as an array of a plurality of serially and parallel connected resonators.

8. A base station power amplifier for a cellular radio network, the power amplifier including at least one interstage band reject filter comprising a shunt acoustic resonator and a series acoustic resonator, the shunt resonator being arranged to resonate generally at the reject frequency band and the series resonator being arranged to anti-resonate generally at the reject frequency band, wherein the resonators are arranged such that there is substantially no acoustic resonance over a predetermined pass band.

9. A power amplifier filter according to claim 8, wherein the acoustic resonators are one port devices.

10. A power amplifier filter according to claim 8, wherein the acoustic resonators are surface acoustic wave resonators.

11. A power amplifier filter according to claim 8, wherein the acoustic resonators are thin film bulk acoustic resonators.

12. A duplexer for a mobile telephone handset including an radio frequency band reject filter comprising a shunt acoustic resonator and a series acoustic resonator, the shunt resonator being arranged to resonate generally at the reject frequency band and the series resonator being arranged to anti-resonate generally at the reject frequency band, wherein the resonators are arranged such that there is substantially no acoustic resonance over a predetermined pass band.

13. A duplexer according to claim 12, wherein the acoustic resonators are one port devices.

14. A duplexer according to claim 12, wherein the acoustic resonators are surface acoustic wave resonators.

15. A duplexer according to claim 12, wherein the acoustic resonators are thin film bulk acoustic resonators.

16. A low noise amplifier input stage including a band reject filter comprising a shunt acoustic resonator and a series acoustic resonator, the shunt resonator being arranged to resonate generally at the reject frequency band and the series resonator being arranged to anti-resonate generally at the reject frequency band, wherein the resonators are arranged such that there is substantially no acoustic resonance over a predetermined pass band.

17. An input stage according to claim 16, wherein the acoustic resonators are one port devices.

18. An input stage according to claim 16, wherein the acoustic resonators are surface acoustic wave resonators.

19. An input stage according to claim 16, wherein the acoustic resonators are thin film bulk acoustic resonators.

* * * * *